United States Patent
Huo et al.

(10) Patent No.: US 11,894,284 B2
(45) Date of Patent: Feb. 6, 2024

(54) SEMICONDUCTOR STRUCTURE HAVING SILVER-INDIUM TRANSIENT LIQUID PHASE BONDING JOINT

(71) Applicant: LIGHT-MED (USA), INC., San Clemente, CA (US)

(72) Inventors: Yongjun Huo, Dana Point, CA (US); Chin Chung Lee, Irvine, CA (US)

(73) Assignee: LMDJ MANAGEMENT LLC, San Clemente, CA (US)

( * ) Notice: Subject to any disclaimer, the term of this patent is extended or adjusted under 35 U.S.C. 154(b) by 191 days.

(21) Appl. No.: 17/535,145

(22) Filed: Nov. 24, 2021

(65) Prior Publication Data

US 2022/0084903 A1    Mar. 17, 2022

Related U.S. Application Data

(62) Division of application No. 16/477,051, filed as application No. PCT/US2019/031041 on May 7, 2019, now Pat. No. 11,373,925.

(51) Int. Cl.
*H01L 23/367* (2006.01)
*H01L 23/373* (2006.01)
(Continued)

(52) U.S. Cl.
CPC ...... *H01L 23/3735* (2013.01); *H01L 21/4871* (2013.01); *H01L 23/367* (2013.01);
(Continued)

(58) Field of Classification Search
CPC .... H01L 23/3735; H01L 23/367; H01L 24/83
See application file for complete search history.

(56) References Cited

U.S. PATENT DOCUMENTS

| 5,829,124 A | 11/1998 | Kresge et al. |
| 6,504,242 B1 | 1/2003 | Deppisch et al. |

(Continued)

FOREIGN PATENT DOCUMENTS

| CN | 105103287 A | 11/2015 |
| CN | 107427967 A | 12/2017 |

(Continued)

OTHER PUBLICATIONS

Baren, "Ag—In (Silver-Indium)", in Binary Alloy Phase Diagrams, ed. by T.B. Massalski, H. Okamoto (ASM Intl, Materials Park, 1990), pp. 15-18.

(Continued)

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A semiconductor structure having a silver-indium transient liquid phase bonding joint is provided. With the ultra-thin silver-indium transient liquid phase bonding joint formed between the semiconductor device and the heat-spreading mount, its thermal resistance can be minimized to achieve a high thermal conductivity. Therefore, the heat spreading capability of the heat-spreading mount can be fully realized, leading to an optimal performance of the high power electronics and photonics devices.

7 Claims, 7 Drawing Sheets

(51) Int. Cl.
*H01L 21/48* (2006.01)
*H01L 23/00* (2006.01)

(52) U.S. Cl.
CPC .............. *H01L 24/27* (2013.01); *H01L 24/29* (2013.01); *H01L 24/83* (2013.01); *H01L 2224/2745* (2013.01); *H01L 2224/27848* (2013.01); *H01L 2224/2908* (2013.01); *H01L 2224/29109* (2013.01); *H01L 2224/29139* (2013.01); *H01L 2224/83825* (2013.01); *H01L 2224/83948* (2013.01); *H01L 2924/01047* (2013.01); *H01L 2924/01049* (2013.01); *H01L 2924/01327* (2013.01); *H01L 2924/351* (2013.01)

(56) References Cited

U.S. PATENT DOCUMENTS

| | | | |
|---|---|---|---|
| 7,023,089 | B1 | 4/2006 | Lu |
| 7,628,309 | B1 | 12/2009 | Eriksen et al. |
| 8,968,830 | B2 | 3/2015 | Ramm et al. |
| 9,673,163 | B2 * | 6/2017 | Otsuka .............. H01L 23/49827 |
| 2006/0051898 | A1 | 3/2006 | Lu et al. |
| 2008/0002460 | A1 | 1/2008 | Tuckerman et al. |
| 2013/0001782 | A1 | 1/2013 | Otsuka et al. |

FOREIGN PATENT DOCUMENTS

| | | |
|---|---|---|
| JP | 2010-516478 A | 5/2010 |
| JP | 2016-515763 A | 5/2016 |
| TW | 200711069 A | 3/2007 |
| TW | 201800239 A | 1/2018 |
| TW | 201900892 A | 1/2019 |

OTHER PUBLICATIONS

European Office Action, dated Jun. 10, 2021, for European Application No. 19768992.0.
Extended European Search Report for European Application No. 19768992.0, dated Nov. 12, 2020.
Huo et al., "Study of Anti-Tarnishing Mechanism in Ag—In Binary System by Using Semi-Quantum-Mechanical Approach", Journal of The Electrochemical Society, 2017, vol. 164, No. 7, pp. C418-C427.
Japanese Notice of Reasons for Refusal for Japanese Application No. 2019-562577, dated Oct. 5, 2021, with an English translation.
Wang et al., "Intermetallic Reaction of Indium and Silver in an Electroplating Process", Journal of Electronic Materials, 2009, vol. 38, No. 9, pp. 1860-1865.
Written Opinion of the International Searching Authority and International Search Report, dated Jul. 29, 2019, for International Application No. PCT/US19/31041.
Wu et al. "A study of chemical reactions of silver and indium at 180° C.", Journal of Materials Science: Materials in Electronics, 2012, vol. 23, No. 12, pp. 2235-2244.
Wu et al., "Bonding Silicon Chips to Aluminum Substrates Using Ag—In System Without Flux", IEEE Transactions on Components, Packaging and Manufacturing Technology, May 2013, vol. 3, No. 5, pp. 711-715.
Yang et al., "Analyses and design for electrochemical migration suppression by alloying indium into silver", Journal of Materials Science: Materials in Electronics, 2018, vol. 29, pp. 13878-13888.
Chinese Office Action and Search Report for Chinese Application No. 201980002092.8, dated Oct. 26, 2023, with English translation.

* cited by examiner

SEMICONDUCTOR STRUCTURE HAVING SILVER-INDIUM TRANSIENT LIQUID PHASE BONDING JOINT

CROSS-REFERENCE TO RELATED APPLICATIONS

This application is a Divisional of U.S. application Ser. No. 16/477,051 filed on Jul. 10, 2019, which is the National Phase of PCT International Application No. PCT/US2019/031041, filed on May 7, 2019, all of which are hereby expressly incorporated by reference into the present application.

BACKGROUND OF THE INVENTION

1. Field of the Invention

The present invention relates to a bonding method and a bonding structure system, and more particularly to a silver-indium transient liquid phase method of bonding a semiconductor device and a heat-spreading mount, and a semiconductor structure having a silver-indium transient liquid phase bonding joint.

2. Background of the Invention

When manufacturing high power semiconductor devices, it is often necessary to design and construct a thermal management structure to sufficiently dissipate the inner generated heat, thereby ensuring the continuous normal operation of the high power devices. Typically, the functionality and capability of the high power semiconductor devices are limited and determined by the provision/availability/effectiveness of such thermal management structure. A common thermal management strategy is to adopt high thermal conductivity material as heat-spreading mounts of the high power semiconductor devices. Among all existing known bulk materials, diamond has the highest thermal conductivity value (~2000 W/mK). As a result, diamond has been frequently selected as a material for the heat-spreading mounts in the high-end products of high power electronics, optoelectronic and photonics. Since the unit price of chemical vapor deposition (CVD) grown polycrystalline diamond in the market has already become sufficiently low, the diamond-based heat-spreading mounts can be considered as economically acceptable by the industrial consumer products.

However, the real challenge in applying diamond-based heat-spreading mounts is how to interconnect or form a reliable bonding joint between the high power semiconductor devices and the diamond. The general design requirements of a good bonding joint for the heat-spreading applications are given below.

First of all, the bonding joint materials must possess reasonable high thermal conductivities, and thickness of the bonding joint must be sufficiently thin, thereby ensuring the overall thermal resistance between the high power semiconductor devices and the diamond can be preferably minimized.

Second, the bonding joint must be mechanically robust and strong, and thermal and chemically stable to support the stability of the integrated structure of device-to-mounts assembly during the subsequent manufacturing process or during normal device operations at elevated temperatures. For the long-term reliability, the bonding joint should maintain its thermal, mechanical and electrical properties after prolonged exposure to the service temperatures or after multiple thermal cycles with reasonable fatigue resistance. It is particularly hard to develop the bonding method with suitable joint materials to interconnect the semiconductor high power devices with the diamond-based heat-spreading mounts for the following reasons.

In particular, diamond is well known for being one of the hardest materials, and can be considered as an absolute rigid body during the bonding process. Therefore, the functional semiconductor devices can be easily cracked or affected by the concentrated stress if applied bonding force is too large during the bonding process.

In addition, the coefficient of thermal expansion (CTE) of diamond is only 1 ppm/° C., which is smaller than most of the commonly used semiconductor materials, e.g., silicon (Si): 2.7 ppm/° C., gallium arsenide (GaAs): 5.9 ppm/° C., gallium nitride (GaN): 5.6 ppm/° C., indium phosphide (InP): 4.6 ppm/° C., silicon carbide (SiC): 4.7 ppm/° C. Therefore, thermally induced stress/strain from the CTE mismatch between the semiconductor devices and diamond heat-spreading mounts can be accumulated during the cooling procedure from the bonding temperature to the room temperature. This CTE mismatch induced stress/strain is usually problematic in the integrated heterogeneous structure, leading to issues such as micro-cracks in the functional semiconductor devices, interfacial delamination, residue stress/strain induced malfunctions, etc. Therefore, a bonding process that requires a less bonding pressure and a lower bonding temperature is highly desirable in the heterogeneous integration between semiconductor devices and diamond-based heat-spreading mounts.

Conventionally, soft solders, such as pure tin (Sn), tin-riched solder, tin-lead (Sn—Pb), pure indium (In), In-riched solder and indium-tin (In—Sn), etc., have been used for semiconductor bonding. However, the yield strength of soft solders are usually too low, so that the bonding layers tend to deform plastically to relax the stress developed. However, the capability of plastic deformation makes soft solder subject to thermal fatigue and creep rupture issues, causing long-term reliability problems. Therefore, the industry prefers to use hard solders in high-end products, where the long-term reliability is of greater importance. The most commonly used hard solders were stemmed from gold-rich eutectic family. Gold-rich eutectic bonding technologies, such as gold-tin (Au—Sn), gold-germanium (Au—Ge) and gold-silicon (Au—Si), etc., have been developed and applied to the heterogeneous integration between the semiconductor devices to the diamond-based heat-spreading mounts. After the development and optimization over decades in industrial applications, the gold-rich eutectic bonding technologies have been proven to be the long-term reliable engineering solutions in joining semiconductor devices to diamond mounts.

Gold-tin eutectic bonding (Au 80 at. % and Sn 20 at. %), which is considered as the most popular method among those mentioned above, has a eutectic point of 280° C., and it has been reported that the reliable bonding process can be only achieved at 320° C. with a very fast temperature ramp rate during heating stage. However, the bonding temperature of 320° C. is considered a relatively high temperature level, which might result in severe CTE mismatch associated issues and undesirable thermal diffusion history that could degrade the original compositions and nano-structures in the functional semiconductor devices. In addition, it has been reported that modified Au—Sn eutectic bonding joint structure with a stress buffer layer of pure gold would help in mitigating the CTE mismatch induced stress/strain issues, but at the cost of adding more overall thermal resistance in the heat dissipation structure. The extreme high raw material cost of gold (>1250 USD/oz.) is another major driving force to develop an alternative bonding solution, which is not from the gold-rich eutectic family but with a similar or even better performance.

The transient liquid phase (TLP) bonding with silver-indium (Ag—In) system is one of promising candidates to provide the alternative bonding solution to the semiconductor industry. In particular, the unit price of a raw material in the international market for silver (~15 USD/oz.) and indium (~5 USD/oz.) are both much lower than gold. The core idea of TLP bonding is to form a bonding joint that can sustain high working temperature at a relatively lower bonding temperature. A sandwich layered bonding structure of the Ag—In joint is highly preferred to provide better interfacial strength and prevent indium migration issues in the long-term. However, the goal in scaling down of the bonding joint thickness is very challenging to achieve, due to the fact that the diffusional behaviors in the Ag—In system are rapid and hard to control.

More specifically, it has been previously recorded that the indium layer thickness in the sandwich bonding structure must be higher than 5 μm in order to achieve a fully-bonded and reliable Ag-riched joint at a relatively low bonding temperature. As a result, the overall bonding joint thickness of the previous work has to be thicker than 30 μm, which is considered too thick for high power semiconductor heat dissipation applications.

SUMMARY OF THE INVENTION

Accordingly, it is an object of the present invention to develop an approach to scale down the Ag—In bonding joint thickness in order to satisfy all of the requirements proposed by the high power semiconductor heat dissipation applications.

To achieve the above-mentioned object, according to a first aspect of the present invention, an Ag—In transient liquid phase (TLP) method of bonding a semiconductor device and a heat-spreading mount is provided. The Ag—In TLP method comprises forming a first bonding structure at a bottom side of the semiconductor device, including: forming a first Ag TLP bonding layer on a bottom of the semiconductor device; forming a second bonding structure at a top side of the heat-spreading mount, including: forming a multi-layer structure having a second Ag TLP bonding layer on a top of the heat-spreading mount, an intermediate transient $AgIn_2$ IMC (intermetallics compound) layer on a top of the Ag TLP bonding layer, an In TLP bonding layer on a top of the intermediate transient $AgIn_2$ IMC layer, and an anti-oxidation $AgIn_2$ IMC capping layer on a top of the In TLP bonding layer; performing an Ag—In bonding process on the first bonding structure and the second bonding structure, thereby converting the first bonding structure and the second bonding structure into a bonding joint including a sandwich bonding structure having a first Ag—In solid solution layer in contact with the semiconductor device, a second Ag—In solid solution layer in contact with the heat-spreading mount, and an $Ag_2In$ IMC layer sandwiched by the first Ag—In solid solution layer and the second Ag—In solid solution layer, such that the bonding joint joins the semiconductor device and the heat-spreading mount, and a thickness of the $Ag_2In$ IMC layer is larger than a thickness of the first Ag—In solid solution layer and larger than a thickness of the second Ag—In solid solution layer.

Furthermore, according to a second aspect of the present invention, a semiconductor structure comprises a semiconductor device; a heat-spreading mount; a bonding joint joining the semiconductor device and the heat-spreading mount, wherein the bonding joint includes a sandwich bonding structure, and the sandwich bonding structure includes: a first Ag—In solid solution layer in contact with the semiconductor device; a second Ag—In solid solution layer in contact with the heat-spreading mount; and an $Ag_2In$ IMC (intermetallics compound) layer sandwiched by the first Ag—In solid solution layer and the second Ag—In solid solution layer, wherein a thickness of the $Ag_2In$ IMC layer is larger than a thickness of the first Ag—In solid solution layer and larger than a thickness of the second Ag—In solid solution layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE ILLUSTRATED EMBODIMENTS

Figure 1:
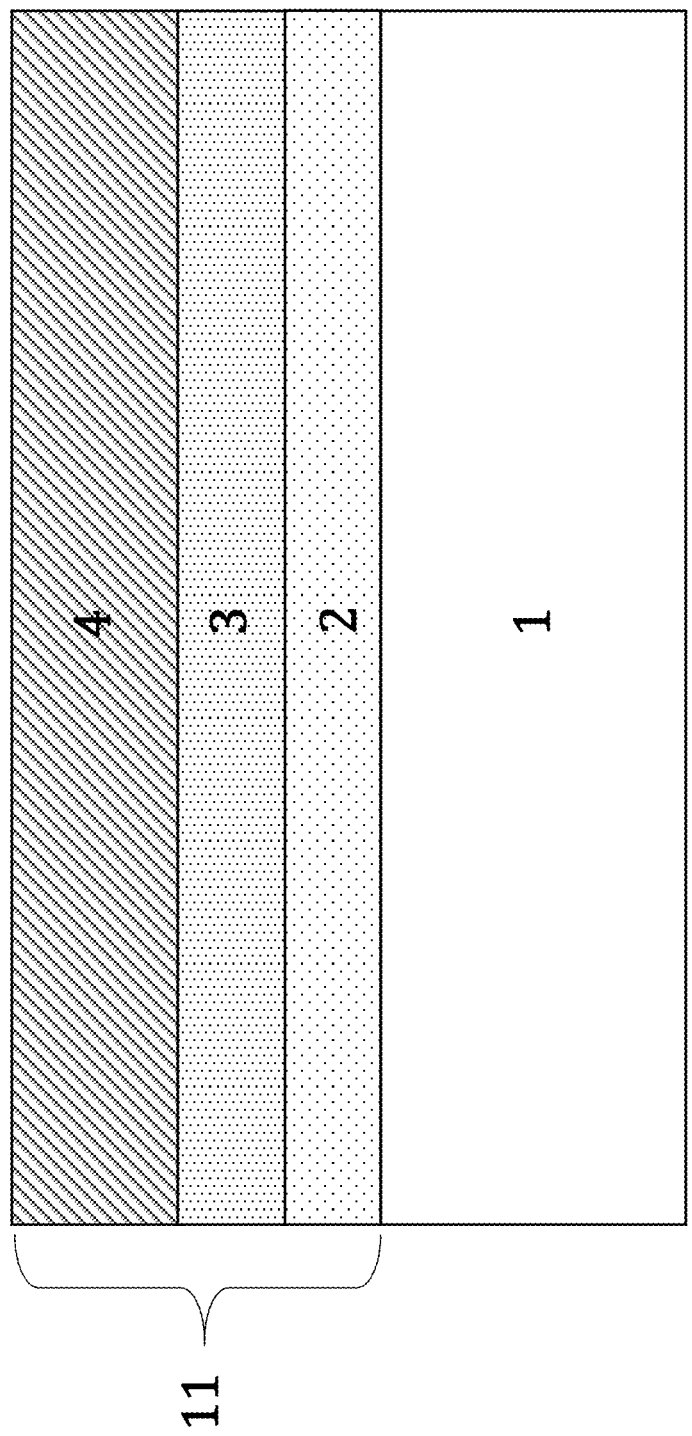
FIG. 1 illustrates a cross-sectional view of metallization layers on a semiconductor device/wafer according to an embodiment of the present invention.

The present invention will now be described in detail with reference to the accompanying drawings, wherein the same reference numerals will be used to identify the same or similar elements throughout the several views. It should be noted that the drawings should be viewed in the direction of orientation of the reference numerals.

In the present application, an embodiment of the silver-indium (Ag—In) transient liquid phase (TLP) bonding method is illustrated, together with the specific designed bonding structures prior to the bonding process and various superior properties of the final Ag-riched bonding joint. With fundamental thermodynamics and kinetics considerations, the diffusional natural behaviors in Ag—In system is better understood and precisely controlled with a sequence of well-designed process prior to the bonding and during the TLP bonding process. Therefore, a new Ag—In TLP bonding method to produce the ultra-thin (≤3 μm) metallurgical Ag-riched bonding joint has been well-developed in the present invention. The illustrated Ag—In TLP bonding method is essentially a fluxless, low temperature and low pressure bonding method. Therefore, it is highly advantageous in the heterogeneous integration between semiconductor devices and diamond-based heat-spreading mounts.

In the following illustrated embodiments, the functional gallium arsenide (GaAs) semiconductor devices and diamond heat-spreading mounts are used as the exemplifying two parts to be bonded together. However, the illustrated Ag—In TLP bonding method can also be applied to other semiconductor devices and other heat-spreading mounts.

As mentioned, diamond is well known for being one of the hardest materials, and can be considered as an absolute rigid body during the bonding process. Therefore, the functional semiconductor devices can be easily cracked or affected by the concentrated stress if applied bonding force is too large during the bonding process.

On the other hand, the GaAs semiconductor device is chosen for its well-known brittle and fragile nature, so that it is one of the hardest cases among various semiconductors to achieve the bonding with diamond. The GaAs semiconductor device is also commonly used to manufacture the high-power semiconductor devices.

FIG. 1 illustrates a semiconductor wafer/device or an individual semiconductor chip 1, e.g., a GaAs wafer/device in the illustrated embodiment, which is well-prepared from the semiconductor front-end fabrications with mirror-like finished surface at the bottom side thereof. In an embodiment, the metallization layers at the bottom side of the semiconductor wafer/device 1 includes an adhesion layer/diffusion barrier 2, an adhesion/CTE (coefficient of thermal expansion) mismatch induced stress compensation layer 3, and a high melting temperature ($T_m$) TLP bonding layer 4.

The adhesion layer/diffusion barrier 2 serves as the metallurgical interconnection between the semiconductor and the following bonding layers, and also prevents the interdiffusion from occurring between the semiconductor and the bonding layers during the subsequent processes. In an embodiment, the adhesion layer/diffusion barrier 2 can be selected from the materials that can form covalent bond, but have a very limited interdiffusion rate with the specific semiconductors to be interconnected and the following bonding layers. It is also preferable to choose the metallization materials that possess similar CTE values with the specific semiconductor to be bonded. In the illustrated embodiment, chromium (Cr) or titanium (Ti) can be preferably used in the fabrication of the adhesion layer/diffusion barrier 2 for the GaAs semiconductor wafer/device.

In addition, in the illustrated embodiment, the adhesion/CTE mismatch induced stress compensation layer 3 is included in the bonding layers structure in order to ensure a good long-term interfacial strength between the adhesion layer/diffusion barrier 2 and the high melting temperature ($T_m$) TLP bonding layer 4. In principle, the CTE values of the materials used in the adhesion/CTE mismatch induced stress compensation layer 3 is intermediate, which should be between the CTE value of the adhesion layer/diffusion barrier 2 and the CTE value of the high melting temperature ($T_m$) TLP bonding layer 4. In an embodiment, gold (Au), platinum (Pt), and nickel (Ni) are suitable candidates that can serve as this intermediate CTE induced stress compensation layer 3. A good combination of layer 2 and layer 3 can be chosen from Cr—Au, Cr—Pt, Ti—Au, Ti—Pt, Ti—Ni, etc. In an embodiment of the bonding metallization layers, the adhesion layer/diffusion barrier 2 has a thickness of 30 nm, and the adhesion/CTE mismatch induced stress compensation layer 3 has a thickness of 50 nm. However, it should be noted that the thickness of the bonding metallization layers can be varied from these values as long as they fulfill the similar purposes.

In the illustrated embodiment, it is preferable to use silver (Ag) as the high $T_m$ material in the Ag—In TLP bonding layer 4. In a preferred embodiment of the bonding metallization layers, the silver of the high $T_m$ TLP bonding layer 4 has a thickness of 1000 nm. It is known that the smoothness of initial bonding surface is crucial to the final quality of the bonding joint. As a result, the physical vapor deposition (PVD) methods, e.g., e-beam evaporation, plasma sputtering, magnetron sputtering, etc., are preferably used to fabricate the bonding structure to ensure a good surface smoothness. In an embodiment, as illustrated in FIG. 1, the bonding structure on the GaAs side is fabricated by a PVD method under one uninterrupted vacuum cycle. As confirmed by atomic force microscopy (AFM) measurement, it would be highly preferable for the following bonding purposes, if the as-deposited surface roughness of the high $T_m$ TLP bonding layer 4 has a root-mean-square (RMS) value of 50 nm or smaller.

It is worthwhile noting that the silver layer of 1000 nm thickness would be considered as a relatively thick layer if using the PVD methods as mentioned above. Therefore, the PVD deposition rate and profile need to be specifically designed in order to avoid the silver blister issue, which is associated the silver thermal migration phenomenon. A silver blister can be grown into hundreds of nano-meters in the vertical direction and a few micron-meters in the lateral direction, and those silver blisters would lead to non-favorable bonding results afterwards. Enhancing the interfacial strength between each deposited layer and decreasing the thermal migrating mobility are the key factors to address the silver blister issue. More specifically, in an embodiment, a slower deposition rate (<0.05 nm/s) at the beginning stage of film growth and lowering substrate temperature during the deposition process would help suppress the silver blister issue completely. In particular, it is highly preferable to divide the silver layer PVD deposition process into several individual steps, which would allow the substrate of the PVD deposition process to naturally cool down at each interval between individual PVD process steps for at least 10 mins. It will help to mitigate substrate temperature and reduce accumulated thermal stress and energy retained in the silver PVD film, thereby completely eliminating silver blister issue.

After the PVD process above, the GaAs wafer/device or other types of semiconductor wafer can be further diced into the individual GaAs semiconductor chips with the TLP bonding structure 11, as shown in FIG. 1.

Figure 2:
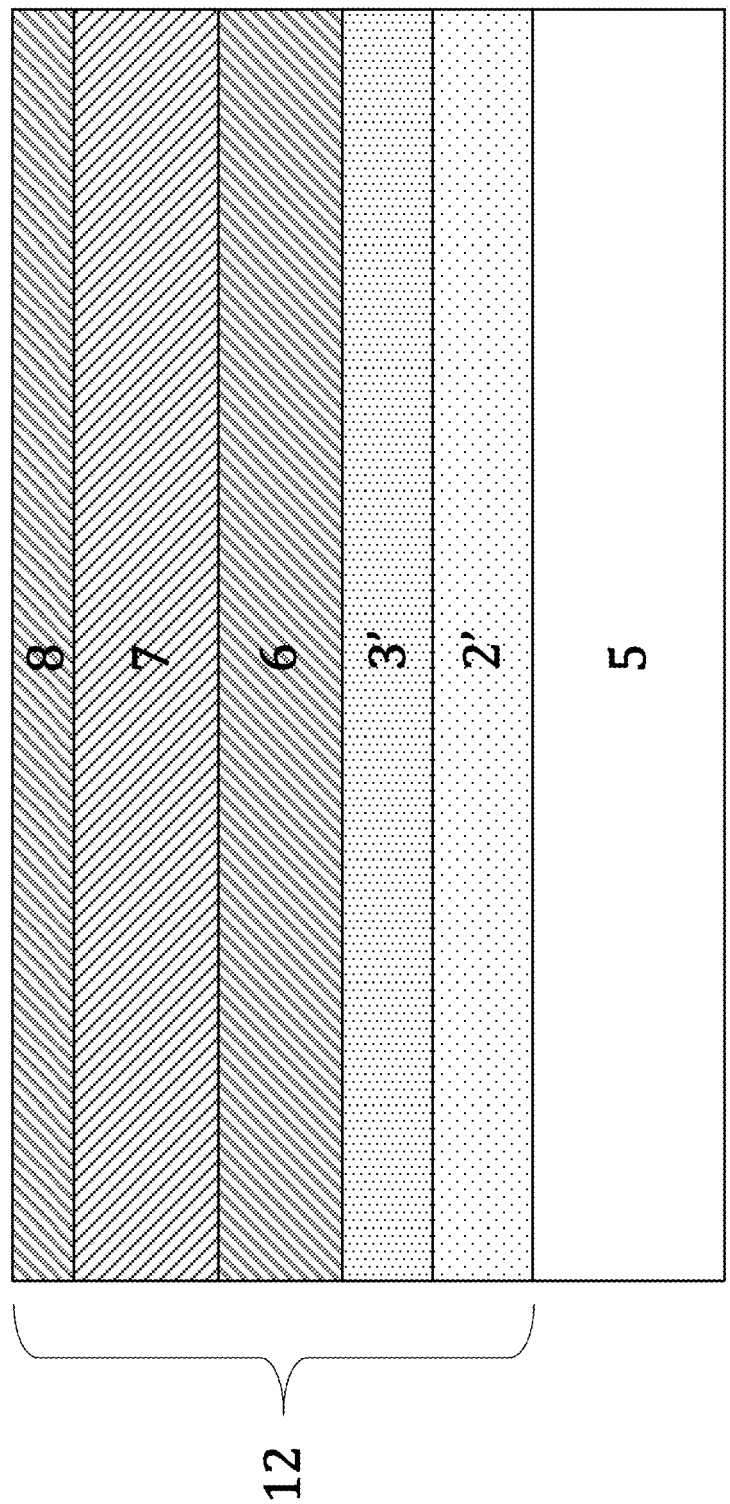
FIG. 2 illustrates a cross-sectional view of metallization layers on a heat-spreading mount according to an embodiment of the present invention.

FIG. 2 illustrates a design of metallization and TLP bonding layers on a top side of a heat-spreading mount 5, e.g., a CVD grown diamond in the illustrated embodiment. The metallization layers 12 on the heat-spreading mount 5 include an adhesion layer/diffusion barrier 2', an adhesion/CTE mismatch induced stress compensation layer 3', a high melting temperature TLP bonding layer 6, a low melting temperature TLP bonding layer 7, and an anti-oxidation capping layer 8.

Prior to metallization, the surface of the CVD grown diamond 5 is preferably prepared with a fine polishing process. The initial surface smoothness and cleanness of CVD grown diamond 5 or other types of heat-spreading mounts are important to the final quality of the metallization layers and the following bonding results. More specifically, a mirror-like finished CVD grown diamond 5 with a surface roughness of 50 nm RMS value or smaller should satisfy this requirement, which is commercially available in the market from various CVD grown diamond manufacturers. Common organic solvents can also be applied to clean and remove the minor contaminations on the as-received CVD grown diamonds from the manufacturers, such as grease, dust particles, etc. Argon (Ar) plasma sputtering cleaning can be applied as the final cleaning step before loading into the PVD deposition chamber, in order to remove any possible organic molecules monolayers remaining on the CVD grown diamond surface, thereby ensuring the good interfacial strength with the adhesion layer. Similar metallization layers design and deposition methods can also be used in the fabrication of the adhesion layer/diffusion barrier 2' and the adhesion/CTE mismatch induced stress compensation layer 3' on the CVD grown diamond 5, or on the other types of heat-spreading mounts in general.

In a preferred embodiment of the Ag—In TLP bonding layers design, the high $T_m$ TLP bonding layer 6 is made of silver (Ag), and the low $T_m$ TLP bonding layer 7 is made of indium (In). In an embodiment, the high $T_m$ TLP bonding layer 6 has a thickness of 1000 nm, and the thickness of the low $T_m$ TLP bonding layer 7 preferably ranges from 750 nm to 1400 nm, which corresponds to the desirable of phase and composition of the final joint.

Indium can get oxidized very easily after exposing to the ambient environment. Therefore, it is expected to form a continuous layer of indium oxide on the top surface. The indium oxide is highly thermal and chemical stable compound, and the existence of indium oxide is detrimental to overall quality of the final bonding joint. Therefore, the anti-oxidation capping layer 8, on the top of the low $T_m$ TLP bonding layer 7, is included in the Ag—In TLP bonding layers design according to an embodiment. Any noble metals can serve as this capping layer to prevent the indium oxidation, but in the illustrated embodiment, silver is the most favorable choice for the Ag—In TLP bonding layers design, thereby eliminating all possible unfavorable ternary phases or other types of precipitates formations at the bonding joint interface.

If the capping layer is too thin, then it cannot fully prevent the oxidation issues. If the capping layer is too thick, then it will be detrimental to the TLP bonding process, leading to the potential incomplete bonding results. In the illustrated embodiment, a silver layer with a thickness around 20 nm can be preferably used to serve as the anti-oxidation capping layer 8. By preventing the oxidation from occurrence, no flux is needed to remove the oxide so that all of the reliability issues related to flux residue can be avoided. Therefore, the current Ag—In TLP bonding method is essentially a fluxless bonding method.

The metallization and the TLP bonding layers structure on the CVD grown diamond or the heat-spreading mount 5 can be fabricated under one uninterrupted vacuum cycle with the PVD methods mentioned above. However, in another embodiment, it is also desirable to fabricate the layer 2', the layer 3' and the layer 6 under one vacuum cycle first, and then conduct an annealing procedure to the heat-spreading mount 5 with deposited layers before the fabricating the layer 7 and layer 8. This annealing procedure can strength the interfacial strength between the metallization layers and the CVD grown diamond or the heat-spreading mount 5. During this annealing procedure, the grain size enlargement and the microstructure evolutions of the high $T_m$ TLP bonding layer 6 would lead to beneficial results for the subsequent TLP bonding process. A similar annealing procedure can also be applied to the GaAs chip with the TLP bonding structure 11. In an embodiment, an annealing procedure with a few hours at the temperature range from 250° C. to 400° C. can be used to fulfill the purposes mentioned above.

The PVD process of the low $T_m$ TLP bonding layer 7, i.e., the indium layer in the illustrated embodiment, is very crucial to the final success of the Ag—In TLP bonding process, which is explained below.

Figure 3:
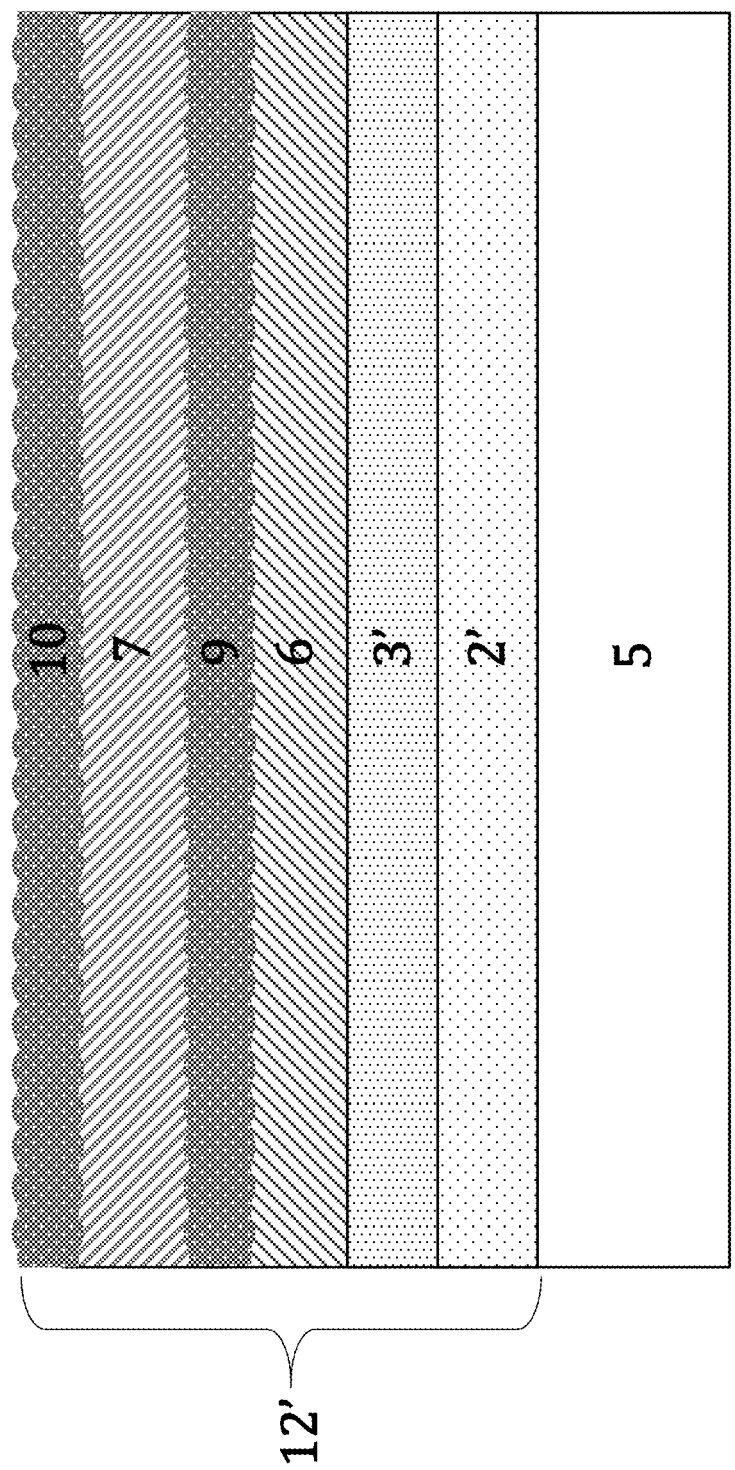
FIG. 3 illustrates a cross-sectional view of actual physical micro-structures of the metallization layers on the heat-spreading mount after the PVD (physical vapor deposition) deposition according to an embodiment of the present invention.

In particular, the interdiffusion and solid-state reactions between two metals commonly occur at elevated temperatures, where the interdiffusion rate is large enough and sufficient thermal energy is provided to overcome the energy barrier of the solid-state reactions. Typically, intermetallic compounds (IMCs) will be formed as the result of the interdiffusion and solid-state reactions. The Ag—In system exhibits a very special thermodynamic and kinetics nature in terms of the interdiffusion and solid-state reactions. It is known that the solid-state reactions between silver and indium can proceed at a relatively low temperature or even at room temperature. During the PVD process, the metallic vapor atoms or molecules are usually energized, e.g., containing thermal energy in the thermal evaporation methods or containing kinetic energy in the sputtering methods. For the most of the metallic systems, a slower deposition rate will result in a PVD fabricated metallic film with a stronger adhesion, a smoother surface, a denser microstructure, and thusly a better overall film quality. However, this general rule does not apply to the Ag—In system. During the PVD process, an in-situ interdiffusion and the following solid-state reactions will occur between the previous fabricated high $T_m$ TLP bonding layer 6 and the low $T_m$ TLP bonding layer 7 being deposited. It is also possible that the high $T_m$ TLP bonding layer 6 can directly react with the incoming indium vapor atoms or molecules at the early stage of the PVD process of the low $T_m$ TLP bonding layer 7. As illustrated in FIG. 3, a portion of the initial high $T_m$ TLP bonding layer 6 and the initial low $T_m$ TLP bonding layer 7 will be converted into an additional layer of IMC at the original metallic PVD film interface (i.e., the interface of the high $T_m$ TLP bonding layer 6 and the low $T_m$ TLP bonding layer 7). The phase of this additional layer has been identified to be the $AgIn_2$ IMC ($\varphi$ phase) by the X-ray diffraction (XRD) method, and it is designated as the intermediate transient $AgIn_2$ IMC layer 9. Therefore, it is essential to control the growth kinetics of this intermediate transient $AgIn_2$ IMC layer 9 in order to obtain a favorable TLP bonding result.

At the early stage of the $AgIn_2$ IMC formation, the silver atoms diffuse into indium film via the interstitial diffusion mechanism at a relatively fast rate, whereas the indium atoms diffuse into the silver film via the substitutional sites diffusion mechanism at a relatively slow rate. Therefore, the initial nucleation and formation of $AgIn_2$ is kinetically favorable at the original interface, growing towards the indium layer side. During the PVD process of the low $T_m$ TLP bonding layer 7, it is found that if a relatively slow deposition rate (<0.1 nm/s) is used, it would result in the formation of a hillock morphological microstructure on the top surface of the bonding layers. The RMS value of the surface roughness of the surface with the hillock microstructure can be as high as a few micron-meters. This hillock microstructure is highly detrimental to the final success of the Ag—In TLP bonding process, leading to partially bonded or non-bonded experimental results. The main factors contributing to the formation of the hillock microstructure can be the prolonged exposure with the energized indium vapor atoms or molecules during PVD process and the following fast Ag—In interdiffusion, the associated solid-state reactions, and the grains migrations and agglomerations. As confirmed by the XRD experimental measurement, if deposited with a relatively slow deposition rate (<0.1 nm/s), most of the indium would have already been converted into $AgIn_2$ IMC, due to the excess in-situ interdiffusion and solid-state reactions during the PVD process.

Therefore, in a preferred embodiment of the PVD process, a relatively high deposition rate is used to fabricate the low $T_m$ TLP bonding layer 7. The deposition rate is designed to resemble the curve of a sinusoidal function, which ranges from 4 nm/s to 5 nm/s with a sinusoidal function period of 20 s in an embodiment. The deposition rate can be monitored by a quartz crystal microbalance (QCM) and well-controlled proportional-integral-derivative (PID) controller with a non-negative feedback system. By using this sinusoidal curve with a higher deposition rate, the formation of the hillock microstructure can be kinetically suppressed to a large extent, and the surface smoothness of the bonding layers can be significantly improved, having a RMS value less than 50 nm. Therefore, the utility of higher indium deposition rate (ranging from 4 nm/s to 5 nm/s in an embodiment) would render a favorable result of the fabricated PVD bonding layers.

After the PVD fabrication of the anti-oxidation capping layer 8, it is expected that the thin silver capping layer would fully react with the indium layer underneath, converting into the anti-oxidation $AgIn_2$ IMC capping layer 10, due to the interdiffusion and solid-state reactions in the Ag—In system that have been mentioned above. The anti-oxidation $AgIn_2$ IMC capping layer 10 should be approximately be three times as thick as the original anti-oxidation capping layer 8 in the illustrated embodiment. The anti-oxidation $AgIn_2$ IMC capping layer 10 will not get oxidized under the ambient environment, and can prevent the indium layer from oxidation, as experimentally confirmed from the XRD measurement. Therefore, the actual physical micro-structures of the metallization and the TLP bonding layers 12' on the heat-spreading mount 5 after the PVD deposition has been fully revealed, as illustrated in FIG. 3.

In an embodiment, prior to the bonding process, it is highly preferable to store the heat-spreading mount 5 with a bonding structure made of the TLP bonding layers 12' under a relatively low temperature (<−20° C.), in order to preserve the optimal TLP bonding layers properties in the long-term.

The detailed TLP bonding process will be described as follows, in order to make the interconnection between a semiconductor chip 1, e.g., a GaAs chip, with the TLP bonding layers 11, and a heat-spreading mount 5, e.g., a CVD grown diamond, with the TLP bonding layers 12', with a reliable metallurgical joint.

Figure 4:
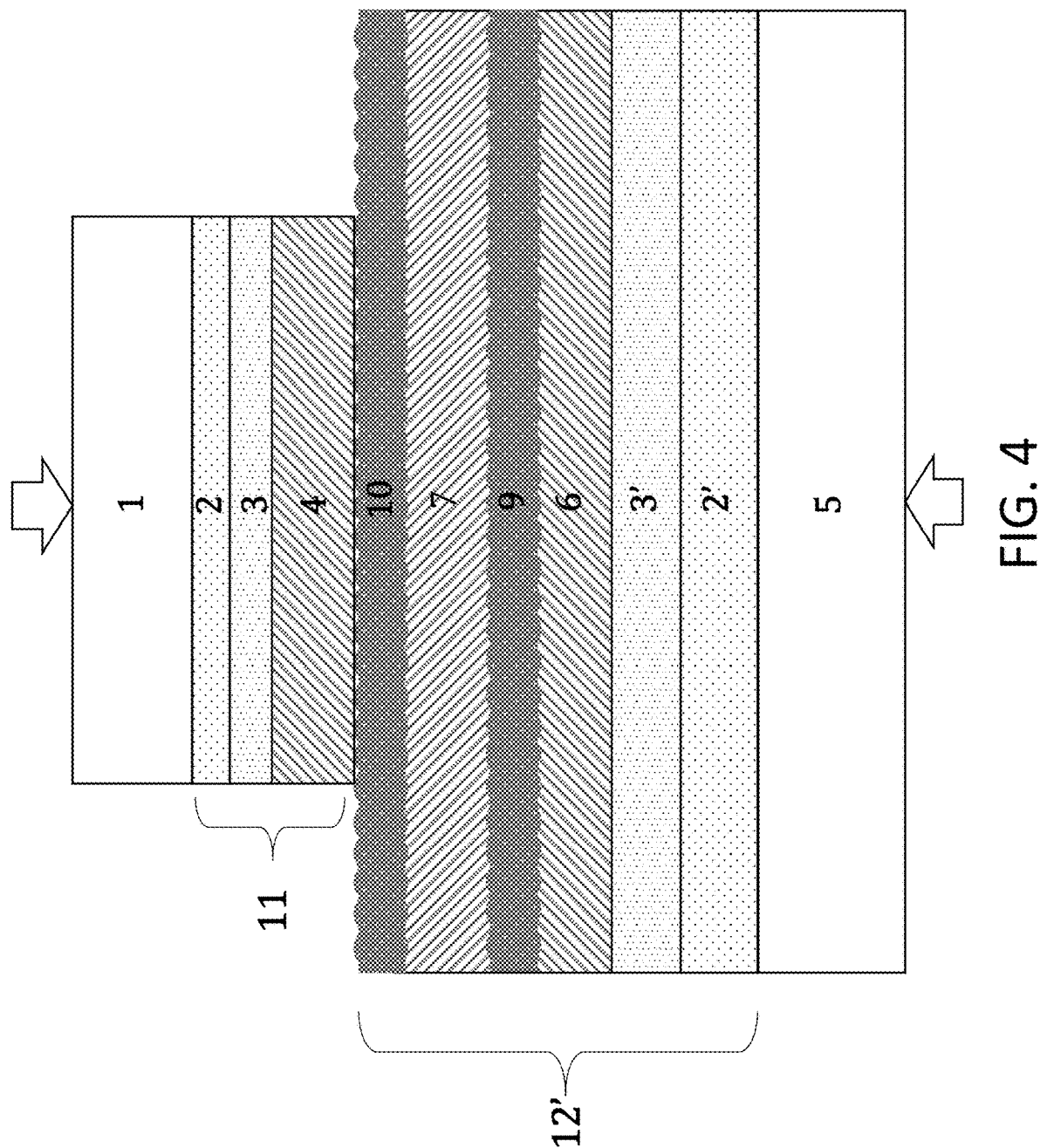
FIG. 4 illustrates a cross-sectional view of the Ag—In TLP prior-to-bonding configuration according to an embodiment of the present invention.

In particular, in a preferred embodiment of the Ag—In TLP prior-to-bonding configuration, as illustrated in FIG. 4, a CVD grown diamond 5 with the TLP bonding layers 12' is firstly located at a bonding stage with a reasonable surface flatness. Next, a GaAs chip 1 with the TLP bonding layers 11 is placed over the CVD grown diamond 5 at the center, with the TLP bonding layers 11 facing down. Therefore, a symmetrical sandwich Ag—In TLP bonding layers configuration is established between the GaAs chip 1 and the CVD grown diamond heat-spreading mount 5.

A static bonding pressure between the GaAs chip 1 and the CVD grown diamond 5 is applied with the bonding tools, either prior to the bonding process or during the bonding process, in order to ensure the atomic-level intimate contact at the bonding interface. The magnitude of the applied bonding pressure should be optimized in order to achieve the favorable bonding results. If the applied bonding pressure is too high, it will cause the generation of the cracks within the GaAs chip 1. If the applied bonding pressure is too low, it will lead to partial bonded results with some gaps or voids located at the original bonding interface. In the illustrated embodiment, the bonding pressure within the range from 100 psi (0.69 MPa) to 300 psi (2.07 MPa) would result in a preferred bonding result, whereas the bonding pressure around 200 psi (1.38 MPa) would render the most favorable one for the GaAs-to-diamond Ag—In TLP bonding process. With this level of magnitude of the bonding pressure, this Ag—In TLP bonding process should be considered as a low pressure bonding process.

In addition, it is also important to ensure even distribution of the applied bonding pressure on the GaAs chip 1. Non-uniformity in the bonding pressure distribution is responsible for the non-favorable bonding results, such as the half-bonded, the edge-bonded only or the corner-bonded only results. Special designed bonding tools with the wobbling mechanism can provide some engineering tolerance to overcome this bonding pressure distribution unevenness issue, which is mainly caused by the non-ideal flatness conditions at the surface of the bonding tools or the bonding stage.

The understandings of the heat conduction path and the temperature gradients of bonding structures are highly related to the overall TLP bonding procedure. The detailed considerations on the thermal structure of the bonding configuration are elaborated as follows.

In particular, during the TLP bonding process, it is desirable to have a symmetrical temperature profile and gradient from the GaAs chip side and the CVD grown diamond side, respectively, to the center of the low $T_m$ TLP bonding layer 7. Since the local temperature is highly related to the physical behaviors such as inter-diffusion, melting, and phase transformation, it is favorable to have a synchronized heating profile from both sides. Therefore, with the symmetrical sandwich Ag—In TLP bonding layers structure, as the arrows depicted in FIG. 4, it is highly preferable to apply the heat from both sides of the bonding structure, in order to achieve the symmetrical temperature profile and gradient. If applying the heat from only one side, the other side would act as a heat-sink and inevitably create a highly asymmetrical temperature profile and gradient, which would result in the non-favorable bonding results.

It is also possible to achieve a nearly symmetrical temperature profile for the asymmetrical sandwich Ag—In TLP bonding layers structure with deliberately calculated heating curves. However, it is much simpler to achieve such nearly symmetrical temperature profiles with the symmetrical sandwich Ag—In TLP bonding layers structure by applying the identical heating curves from both sides of the bonding structure.

Figure 5:
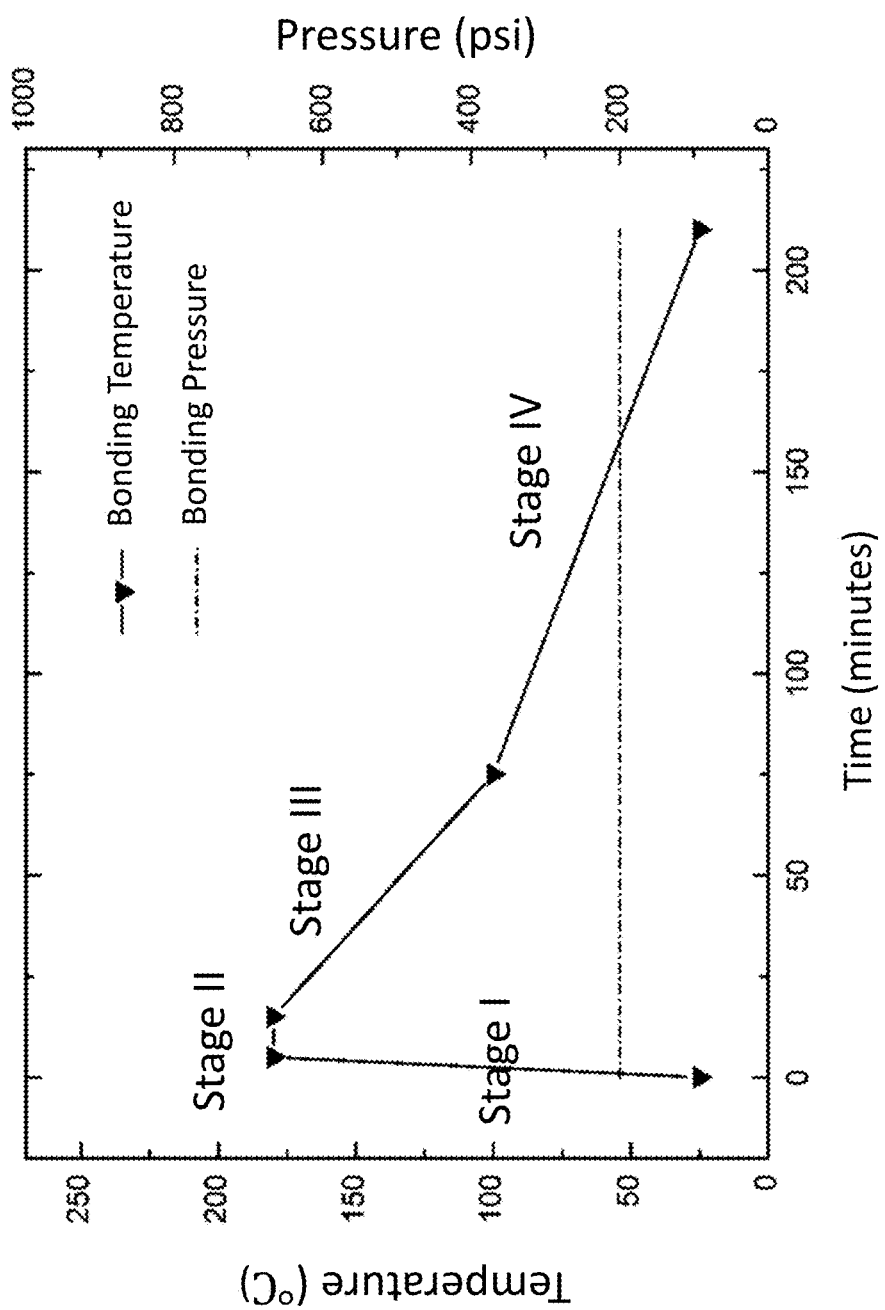
FIG. 5 illustrates the applied bonding temperature and pressure profiles during the Ag—In TLP bonding process according to an embodiment of the present invention.

FIG. 5 illustrates a preferred embodiment of the applied bonding temperature and pressure profiles during the Ag—In TLP bonding process with the favorable results. As depicted in FIG. 5, the overall Ag—In TLP bonding process can be divided into four individual stages, and the actual physical TLP bonding mechanism in each stage will be elaborated with details as follows.

First of all, Stage I is the heating ramp stage, and the heating ramp rate is one of the most important parameters in the temperature profile. The Ag—In TLP bonding in the illustrated embodiment does not require a very quick ramp rate (~100 K/s), whereas the conventional Au—Sn eutectic bonding usually demands so. It has been demonstrated that a favorable bonding result can be achieved with a moderate heating ramp rate (ranging from 1K/s to 20K/s) in the illustrated embodiment.

More specifically, at the very beginning of Stage I, indium in the low $T_m$ TLP bonding layer 7 will firstly experience the solid-state interdiffusion and reactions with the high $T_m$ TLP bonding layer 4 on the GaAs chip side and the high $T_m$ TLP bonding layer 6 on the CVD grown diamond side. The early stage of solid-state interdiffusion and reactions must be conducted through the intermediate transient IMC layer 9 and the anti-oxidation IMC capping layer 10, which leads to further growth of the intermediate transient IMC layer 9 and the anti-oxidation IMC capping layer 10. Therefore, the original and the further grown intermediate transient IMC layer 9 and the anti-oxidation IMC capping layer 10 would act as the self-limiting interdiffusion barriers to prevent the low $T_m$ TLP bonding layer 7 from consuming too fast or diffusing too rapidly, thereby preserving adequate indium to generate enough liquid phase in the subsequent TLP bonding stage.

Figure 6:
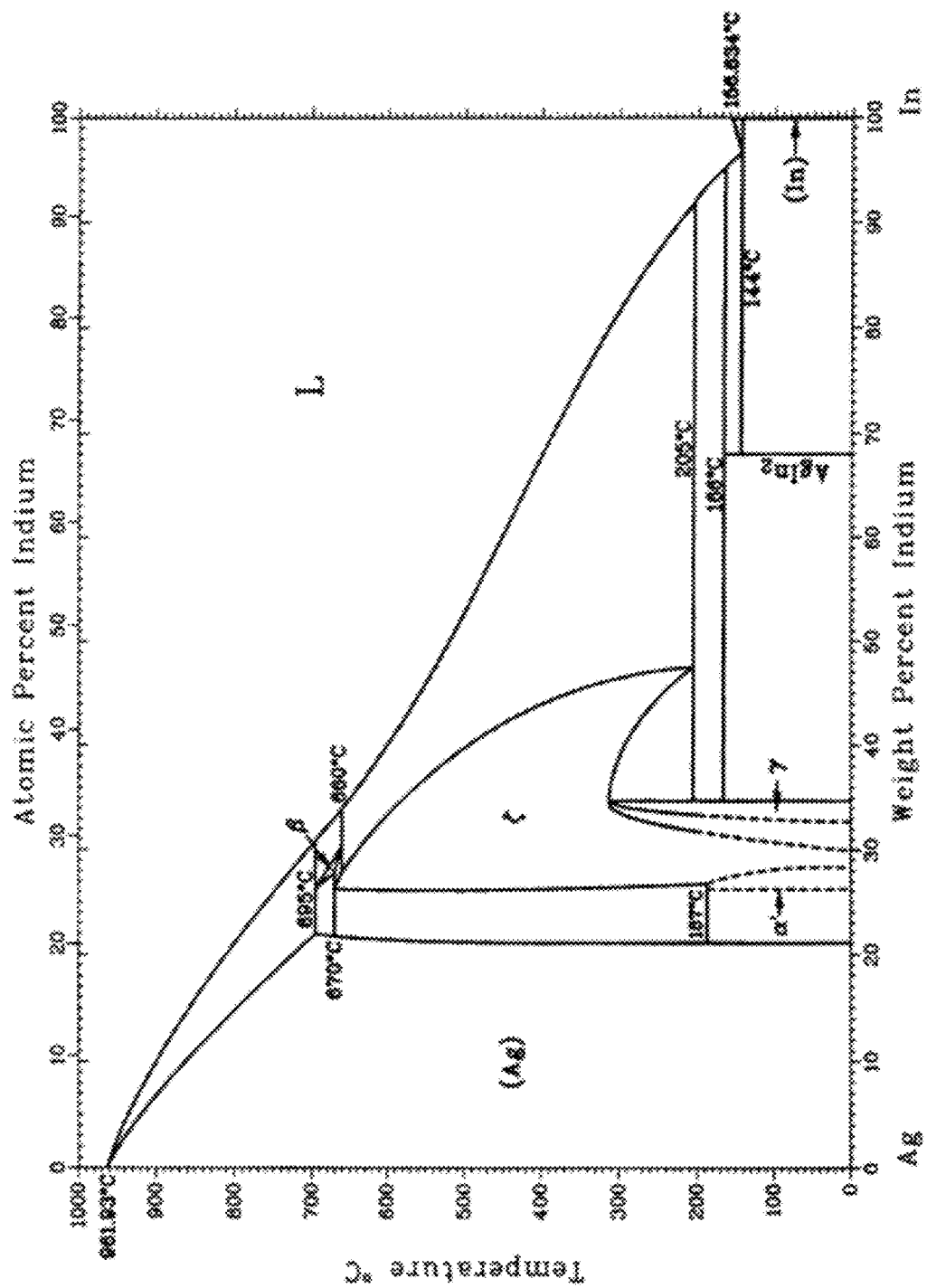
FIG. 6 illustrates a Ag—In binary phase diagram.

According to the Ag—In binary phase diagram as shown in FIG. 6, the pure indium melts at 156.6° C. Therefore, a large amount of the liquid phase will be generated when the bonding temperature rises upon 160° C. It has been experimentally proven that the wettability of the liquid indium on the surface of the $AgIn_2$ IMC is adequately good. The liquid-solid interdiffusion and reactions of the Ag—In TLP bonding process start at this point. Having enough generated liquid phase at this moment is very crucial to the success of the TLP bonding process. With the applied bonding pressure, the flow of the liquid phase provides the mobility for the bonding materials to overcome the original roughness of the bonding layers surface, thereby completely eliminating the non-favorable voids and gaps at the original bonding interface. The voids and gaps would result in additional thermal resistance in the thermal structure, which is highly detrimental to the overall performance of high power electronics and high power photonics. It has been experimentally proven that 100% truly bonded area over the entire Ag—In joint can be achieved with consistency.

As depicted in FIG. 6, the $AgIn_2$ IMC in the intermediate transient IMC layer 9 and the anti-oxidation $AgIn_2$ IMC capping layer 10 will convert into the indium in liquid phase and the solid-state $Ag_2In$ IMC (y phase) at 166° C., via a peritectic decomposition reaction. Unlike the liquid phase generated by the melting indium layer, the liquid phase generated via the peritectic decomposition reaction will be much less in quantity. In addition, it would mix together with the solid-state $Ag_2In$ IMC in the peritectic microstructure. Therefore, the liquid phase generated by the peritectic decomposition reaction alone cannot form a continuous wetting layer over the entire joint area, nor provide the adequate material flow mobility. In other words, it would lead to non-favorable bonding results if the indium in the low $T_m$ TLP bonding layer 7 had already been largely consumed before melting. However, the existence of the $AgIn_2$ IMC in the intermediate transient IMC layer 9 with a certain original thickness can provide the self-limiting interdiffusion mechanism, thereby preventing the over-interdiffusion phenomenon from occurring. It is known that the indium preferably diffuses through the grain boundaries of silver at much faster rate than through lattice interdiffusion path. Without the self-limiting interdiffusion barrier with an adequate thickness, the direct contact of liquid indium to silver would lead to the over-interdiffusion phenomenon due to the excess interdiffusion through grain boundary. The over-interdiffusion occurrence will result in a porous microstructure of the bonding joint, which is usually non-favorable to minimizing the thermal resistance and the long-term reliability of the bonded semiconductor devices at higher temperatures. Therefore, with a determined nominal thickness of a bonding joint, the volume ratio of between the prior-to-bonding $AgIn_2$ IMC in the intermediate transient IMC layer 9 and the remaining indium in the low $T_m$ TLP bonding layer 7 is one of the important parameters to be optimized, in order to obtain the most favorable Ag—In TLP bonding result.

In an embodiment, a volume ratio of the prior-to-bonding $AgIn_2$ IMC in the intermediate transient $AgIn_2$ IMC layer 9 to the remaining indium in the low $T_m$ TLP bonding layer, i.e., $(AgIn_2:In)_{vol}$, is in the range of 1:3 to 1:1, in order to achieve favorable Ag—In TLP bonding results. This volume ratio value can be easily controlled by the deliberately aging process before storing the samples in the environment with a lower temperature (<-20° C.). Thus, a desirable thickness of the $AgIn_2$ IMC can be formed while preserving enough indium layer in the Ag—In TLP bonding layers structure. An optimal combination of the volume ratio mentioned above and the heating ramp rate at TLP bonding Stage I would be highly preferable in order to obtain a bonding result with a desirable joint quality.

Stage II is the liquid-solid interdiffusion stage of the Ag—In TLP bonding process. At Stage II, the bonding temperature reaches to 180° C., which is the peak temperature of the Ag—In TLP bonding process. The peak temperature of the Ag—In TLP bonding process is much lower than that of the conventional Au—Sn eutectic bonding method (320° C.). Therefore, the Ag—In TLP bonding is a low temperature bonding method, and all of the thermally-induced issues should be inherently much less severe than the case in using the conventional Au—Sn eutectic bonding method.

At Stage II, the liquid phase of indium in the low $T_m$ TLP bonding layer 7 continue to inter-diffuse and react with the high $T_m$ TLP bonding layer 4 and the high $T_m$ TLP bonding layer 6, upwards and downwards respectively, via the transient peritectic layers. As the interdiffusion and reactions proceed, the silver concentrations in the transient interlayers, i.e., the low $T_m$ TLP bonding layer 7 and the transient peritectic layers, will keep increasing. Therefore, the melting temperature of the transient interlayers will keep increasing, so that the solidification of the transient interlayers starts to occur at the constant holding temperature range (between 180° C. and 205° C. in an embodiment). In the meantime, during Stage II, $AgIn_2$ IMC in the intermediate transient $AgIn_2$ IMC layer 9 and the anti-oxidation $AgIn_2$ IMC capping layer 10 have been fully converted into indium in the liquid phase and the solid-state $Ag_2In$ IMC in the y phase. The liquid phase of indium, generated from the peritectic decomposition reaction in the intermediate transient $AgIn_2$ IMC layer 9 and the anti-oxidation $AgIn_2$ IMC capping layer 10, will also participate in the inter-diffusion and reaction with the high $T_m$ TLP bonding layer 4 and the high $T_m$ TLP bonding layer 6. Eventually, all of the liquid phase in the transient interlayers will be completely solidified at the constant holding temperature range. Therefore, the initial bonding joint between the GaAs chip 1 and the CVD grown diamond 5 has been formed at this point. A moderate constant temperature holding time (~10 minutes in an embodiment) would be enough to facilitate the liquid-solid interdiffusion and reactions to proceed until finishing the complete solidification process, i.e., until no peritectic decomposition reaction can be performed at the constant holding temperature range.

Stage III is the homogenization stage of the Ag—In TLP bonding process. At the end of Stage II, the interlayers should be completely solidified, but not fully homogeneous yet. During Stage III of the Ag—In TLP bonding process, the temperature is gradually decreasing with a cooling down ramp rate ranging from 0.02K/s to 1K/s in an embodiment, but still remaining at a relatively high homologous temperature ($T_h$) of the bonding joint ($T_h$>0.4). Therefore, with adequate thermal energy provided at Stage III, the solid-state interdiffusion and reactions can still proceed until the complete homogenization finished. At stage III, the recrystallization process occurs, where the enlarged grains from both sides of TLP bonding layers can be completely merged together. The original bonding interface would disappear at this point, indicating that a reliable metallurgical joint has been formed.

Figure 7:
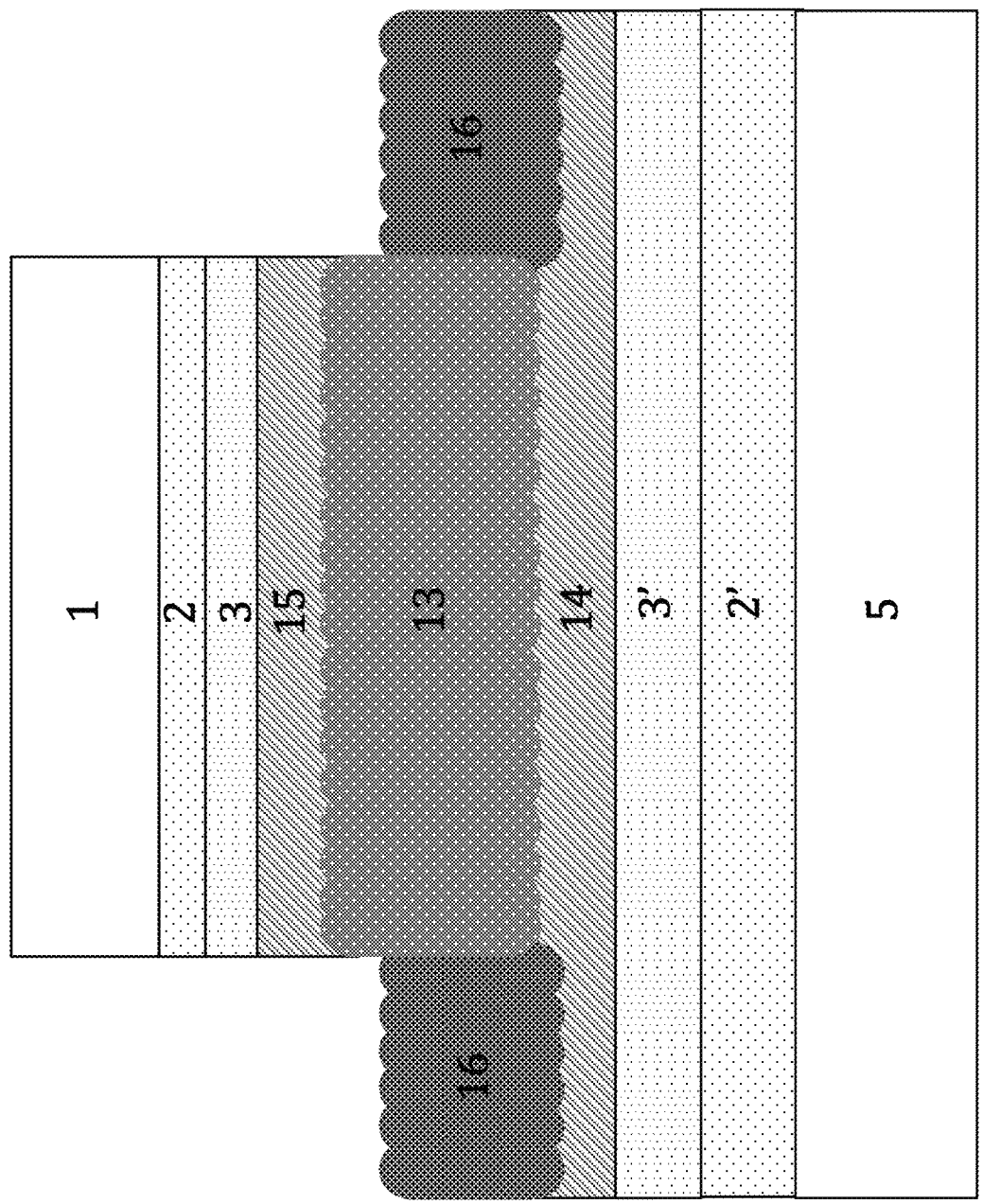
FIG. 7 illustrates a cross-sectional view of a Ag—In TLP bonding joint between the semiconductor device and the heat-spreading mount according to an embodiment of the present invention.

As illustrated in the embodiment of FIG. 7, with a specific Ag—In TLP bonding layers design, the Ag—In TLP bonding joint with $Ag_2In$ IMC as the final composition can be achieved at the end of Stage III. After the complete homogenization, it is expected that the final Ag—In TLP bonding joint, as a sandwich bonding structure, consists of a homogenous $Ag_2In$ IMC layer 13, an intermediate Ag—In solid solution layer 14 at the heat-spreading mount side, and an intermediate Ag—In solid solution layer 15 at the semiconductor device side. The homogenous $Ag_2In$ IMC layer 13 can be designed to occupy the major portion of the final Ag—In joint. In particular, the thickness of the $Ag_2In$ IMC layer 13 is larger than the thickness of the Ag—In solid solution layer 14 and larger than the thickness of the second Ag—In solid solution layer 15. It is known that the interfacial strength of the $Ag_2In$ IMC to the metallization layer 2 or layer 3 is not strong, but can strongly adhere to the intermediate Ag—In solid solution layer. It is also known that the intermediate Ag—In solid solution layer can adhere well to the metallization layer 2 or layer 3. Therefore, the Ag—In prior-to-bonding layers structure is designed to preserve the two intermediate Ag—In solid solution layers 14, 15 respectively at each interface after the complete homogenization. This can be only achieved when using the sandwich Ag—In TLP bonding layers structure.

As embodied in FIG. 7, the $Ag_2In$ IMC layer 13 is fully separate from the first metallization layers 2 and 3 by the Ag—In solid solution layer 15, and is fully separate from the metallization layers 2' and 3' by the Ag—In solid solution layer 14.

In addition, since the size of the heat-spreading mount 5 is usually larger than that of the semiconductor chip 1, and the non-bonded area 16 on the heat-spreading mount side has experienced a reflow procedure during the bonding process, the non-bonded area 16 has been converted into a composite material of $Ag_2In$ IMC and $AgIn_2$ IMC. As embodied in FIG. 7, the non-bonded area 16 is in contact with a lateral sidewall of the $Ag_2In$ IMC layer 13 and a top surface of the Ag—In solid solution layer 14.

Stage IV is the thermal stress relaxation stage of the Ag—In TLP bonding process. Due to the CTE mismatch between the GaAs chip 1 and the CVD grown diamond 5, the thermal stress will be induced during the cooling down stage of the bonding process. A slow cooling down rate (<0.01 K/s in an embodiment) in this stage is highly preferable for the purpose of releasing the thermal stress. A low temperature post-bonding annealing around 100° C. can also help further release the residual thermal stress. It has been experimentally demonstrated that a thermally-induced residual stress-free semiconductor device can be obtained after Stage IV of the Ag—In TLP bonding process, or after a low temperature post-bonding annealing process.

It has been experimentally demonstrated that the Ag—In TLP bonding process can be successfully conducted in the ambient environment. However, it is preferable to conduct the Ag—In TLP bonding process under intermediate low level of vacuum environment (~50 mTorr), in order to suppress the potential indium oxidation issue during the Ag—In TLP bonding process. It is also favorable to achieve a good bonding joint quality with the utility of the common forming gas, such as hydrogen gas or formic acid gas, to provide a reducing environment during the Ag—In TLP bonding process.

As a result, a uniform, homogeneous, porous-free, and residual stress-free Ag—In ultra-thin (≤3 μm) metallurgical joint can be formed between the GaAs chip and the CVD grown diamond heat-spreading mount, without inducing any cracks in the GaAs chip. The thickness of the bonding joint is considered to be a critical parameter for the heat dissipation purpose in the high power electronics and photonics. With the ultra-thin bonding joint, its thermal resistance can be minimized to achieve a high thermal conductivity, compared to the joint made by the conventional method (>30 μm). Therefore, the heat spreading capability of the CVD grown diamonds can be fully realized, leading to an optimal performance of the high power electronics and photonics devices.

The advantages of the illustrated Ag—In TLP bonding method will be described in details, attributing to the numerous excellent materials properties of the Ag—In bonding joint.

As illustrated in FIG. 7, in one preferred embodiment, the Ag—In TLP bonding joint mainly consists of $Ag_2In$ IMC (y phase) 13. In particular, the thickness of the $Ag_2In$ IMC layer 13 is larger than the thickness of the Ag—In solid solution layer 14 and larger than the thickness of the second Ag—In solid solution layer 15. Therefore, the mechanical, thermal and chemical properties of the final joint resemble the material properties of $Ag_2In$ IMC in the y phase. According to the Ag—In binary phase diagram shown in FIG. 6, $Ag_2In$ IMC in the y phase will be converted into $Ag_2In$ IMC in the phase, at 300° C., through a solid-state phase transformation process. As the temperature increases, $Ag_2In$ IMC in phase will still fully remain in the solid-state form, up to 600° C. Although the Ag—In TLP bonding joint is formed at a relatively low bonding temperature, e.g., 180° C. in an embodiment, the nominal working temperature of the bonding joint in the $Ag_2In$ IMC form should be at least higher than 300° C., which satisfies the most fundamental requirement of the high power and high temperature electronics and photonics. As indicated by the performance of the operating high power devices, the temperature conductivity of the bonding joint with $Ag_2In$ IMC is comparable good to that of a bonding joint with the conventional Au—Sn eutectic method. Therefore, it is expected that the bonding joint in the $Ag_2In$ IMC form has a relatively high thermal conductivity, which is highly favorable to the utility of the high power devices.

The high temperature stability of the $Ag_2In$ IMC bonding joint is also excellent. The $Ag_2In$ IMC bonding joint can sustain a high temperature storage test and a thermal cycling test, without showing major thermal degradations. Therefore, the $Ag_2In$ IMC bonding joint is considered as an excellent candidate to ensure normal operations of the high power devices at elevated temperatures.

The $Ag_2In$ IMC bonding joint also has a superior chemical stability. The $Ag_2In$ IMC bonding joint can sustain a long time annealing procedure at the elevated temperature in the air, without showing any oxidation issues or degradations. In the chemical etching experiments, the materials in the layers 13-16 can sustain a long time etching process under highly oxidizing chemical solutions (e.g., $HNO_3$, $H_2O_2$), showing a good anti-oxidization property of the $Ag_2In$ IMC bonding joint. It is known that pure silver can be easily corroded by the sulfur-containing corrosive gases, such as sulfur vapor, hydrogen sulfide ($H_2S$), sulfur dioxide ($SO_2$), and carbonyl sulfide. The corrosion product, silver sulfide ($Ag_2S$) is detrimental to the long-term reliability and life-time of silver-containing electronics. This is known as the tarnishing issue of silver. It has been recently discovered that the $Ag_2In$ IMC exhibits the complete anti-tarnishing property, due to the alternation of the valence band when alloying with indium.

Electrochemical migration (ECM) is another serious reliability issue to concern when using silver-based material as the interconnection in the high voltage environment. Driven by a high electrical field, the pure silver tends to form dendrites or whiskers, causing the potential short-circuit failures in the long-term. It has been recently discovered that the $Ag_2In$ IMC exhibits the complete anti-electrochemical migration property as well, showing zero leakage current in a standard water drop test (WDT). Therefore, the $Ag_2In$ IMC bonding joint is completely free from the major concerns of the tarnishing issue and the electrochemical migration issue, thereby ensuring the long-term reliability of the devices with its superior chemical stability.

Mechanical strength of the bonding joint material determines the mechanical stability of the bonded semiconductor devices. Typically, intermetallic compounds are brittle under tensile stress in their nature, so that the mechanical toughness under compression stress can be used to evaluate their mechanical strengths. In a standard micro-indentation test, $Ag_2In$ IMC exhibits a certain level of ductility under compression stress, and cannot be cracked at the maximum force loading (1000 gf), whereas the most of common IMCs (e.g., $Cu_6Sn_5$) would be cracked at a much lighter force. Therefore, $Ag_2In$ IMC exhibits a high mechanical toughness, which is highly favorable to the mechanical stability of the bonding joint. On the other hand, $Ag_2In$ IMC resembles the mechanical properties of the typical hard solders, which means it would not suffer from the creep or the fatigue issue in the long-term.

In view of the above, the technical details of the illustrated Ag—In TLP bonding method to produce an ultra-thin metallurgical joint are fully disclosed. With a much lower raw material cost, compared to the conventional gold-rich bonding methods, the illustrated Ag—In TLP bonding method is expected to provide an economical-friendly die-attachment method for the heat dissipation purposes of the high power semiconductor devices. This method allows joining at a relatively low temperature without using any flux. Therefore, in addition to the conventional chip-to-chip bonding approach, it can also be adopted as a wafer-level (chip-to-wafer or wafer-to-wafer) bonding method, to increase the yield and productivity in the mass production. For the industrial applications, the illustrated Ag—In TLP bonding method can be used in the manufacture of the various high power electronics and high power photonics devices, such as high power laser diodes (LDs), high power light-emitting diodes (LEDs), vertical-cavity external surface-emitting lasers (VECSELs), high power metal-oxide-semiconductor field-effect transistor (MOSFETs), etc., where the heat dissipation capability largely determines the overall performance of the devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor structure comprising:
a semiconductor device;
a heat-spreading mount;
a bonding joint joining the semiconductor device and the heat-spreading mount, wherein the bonding joint includes a sandwich bonding structure, and the sandwich bonding structure includes:
a first Ag—In solid solution layer in contact with the semiconductor device;
a second Ag—In solid solution layer in contact with the heat-spreading mount; and
an $Ag_2In$ IMC (intermetallics compound) layer sandwiched by the first Ag—In solid solution layer and the second Ag—In solid solution layer, wherein a thickness of the $Ag_2In$ IMC layer is larger than a thickness of the first Ag—In solid solution layer and larger than a thickness of the second Ag—In solid solution layer.

2. The semiconductor structure of claim 1, further comprising a layer of a composite material of $Ag_2In$ IMC and $AgIn_2$ IMC in contact with a lateral sidewall of the $Ag_2In$ IMC layer and a top surface of the second Ag—In solid solution layer.

3. The semiconductor structure of claim 2, wherein the layer of the composite material of $Ag_2In$ IMC and $AgIn_2$ IMC surrounds the lateral sidewall of the $Ag_2In$ IMC layer.

4. The semiconductor structure of claim 1, wherein the sandwich bonding structure has a thickness of equal to or less than 3 μm.

5. The semiconductor structure of claim 1, wherein
the semiconductor device includes a first metallization layer at a bottom thereof and in contact with the first Ag—In solid solution layer, and
the heat-spreading mount includes a second metallization layer at a top thereof and in contact with the second Ag—In solid solution layer.

6. The semiconductor structure of claim 5, wherein the $Ag_2In$ IMC layer is fully separate from the first metallization layer by the first Ag—In solid solution layer, and is fully separate from the second metallization layer by the second Ag—In solid solution layer.

7. The semiconductor structure of claim 5, wherein:
the first metallization layer includes:
a first CTE (coefficient of thermal expansion) mismatch induced stress compensation layer at the bottom of the semiconductor device and in contact with the first Ag—In solid solution layer; and
a first diffusion barrier layer above the first CTE mismatch induced stress compensation layer and fully separate from the first Ag—In solid solution layer by the first CTE mismatch induced stress compensation layer; and
the second first metallization layer includes:

a second CTE mismatch induced stress compensation layer at the top of the heat-spreading mount and in contact with the second Ag—In solid solution layer; and a second diffusion barrier layer below the first CTE mismatch induced stress compensation layer and fully separate from the second Ag—In solid solution layer by the second CTE mismatch induced stress compensation layer.

\* \* \* \* \*